United States Patent
Guo et al.

(10) Patent No.: US 12,317,518 B2
(45) Date of Patent: May 27, 2025

(54) ISOLATION DEVICE WITH SAFETY FUSE

(71) Applicant: TEXAS INSTRUMENTS INCORPORATED, Dallas, TX (US)

(72) Inventors: Honglin Guo, Dallas, TX (US); Thomas Dyer Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 612 days.

(21) Appl. No.: 17/512,415

(22) Filed: Oct. 27, 2021

(65) Prior Publication Data
US 2023/0129759 A1    Apr. 27, 2023

(51) Int. Cl.
*H10D 1/60* (2025.01)
*H01H 85/02* (2006.01)
*H01H 85/05* (2006.01)
*H01L 23/525* (2006.01)

(52) U.S. Cl.
CPC .......... *H10D 1/60* (2025.01); *H01H 85/0241* (2013.01); *H01H 85/05* (2013.01); *H01L 23/5256* (2013.01); *H01H 2085/0283* (2013.01); *H01H 2229/05* (2013.01); *H01H 2239/006* (2013.01)

(58) Field of Classification Search
None
See application file for complete search history.

(56) References Cited

U.S. PATENT DOCUMENTS

| | | | | |
|---|---|---|---|---|
| 3,805,208 A | * | 4/1974 | McAlister | H01H 85/044 337/228 |
| 3,913,219 A | * | 10/1975 | Lichtblau | G08B 13/2437 29/25.42 |
| 4,296,398 A | * | 10/1981 | McGalliard | H01H 85/046 361/104 |
| 4,460,914 A | * | 7/1984 | te Velde | H01L 23/5256 365/96 |
| 4,679,310 A | * | 7/1987 | Ramachandra | H01H 85/046 148/DIG. 147 |
| 5,097,246 A | * | 3/1992 | Cook | H01H 85/046 337/231 |
| 5,155,462 A | * | 10/1992 | Morrill, Jr. | H01G 9/0003 337/3 |
| 5,256,899 A | * | 10/1993 | Rangappan | H01L 23/5256 365/96 |

(Continued)

FOREIGN PATENT DOCUMENTS

| | | | | |
|---|---|---|---|---|
| DE | 19738575 A1 | * | 6/1999 | H01H 85/0411 |
| DE | 10306949 A1 | * | 12/2003 | H01L 23/5258 |

*Primary Examiner* — Scott B Geyer
(74) *Attorney, Agent, or Firm* — Andrew R. Ralston; Frank D. Cimino

(57) ABSTRACT

A semiconductor device can include first and second conductive layers that can be positioned over a substrate, and at least one dielectric layer between the first and second conductive layers. The at least one dielectric layer can be positioned over at least a portion of the second conductive layer, and the first conductive layer can be positioned over a portion of the least one dielectric layer. The semiconductor device can further include a third conductive layer that can be positioned over the substrate and can be conductively connected to the second conductive layer and the substrate. The third conductive layer includes a fusible link.

17 Claims, 11 Drawing Sheets

(56) References Cited

U.S. PATENT DOCUMENTS

| | | | | |
|---|---|---|---|---|
| 5,814,876 A * | 9/1998 | Peyre-Lavigne | ... | H01L 23/5256 257/209 |
| 5,914,649 A * | 6/1999 | Isono | ... | H01H 85/0411 337/296 |
| 5,982,268 A * | 11/1999 | Kawanishi | ... | H01H 85/044 337/231 |
| 6,496,053 B1 * | 12/2002 | Daubenspeck | ... | H01L 23/5258 257/532 |
| 6,838,367 B1 * | 1/2005 | Rhodes | ... | H01L 23/53242 438/281 |
| 6,933,591 B1 * | 8/2005 | Sidhu | ... | H01L 23/5256 438/281 |
| 9,865,537 B1 * | 1/2018 | Male | ... | H01L 23/49562 |
| 10,861,665 B1 * | 12/2020 | Backman | ... | H01L 28/20 |
| 2005/0239273 A1 * | 10/2005 | Yang | ... | H01L 23/5258 257/E23.15 |
| 2007/0063313 A1 * | 3/2007 | Barth | ... | H01L 23/5256 257/209 |
| 2007/0085181 A1 * | 4/2007 | Kroneder | ... | H01L 24/48 257/E25.016 |
| 2008/0208270 A1 * | 8/2008 | Linder | ... | A61N 1/3956 361/91.1 |
| 2010/0295149 A1 * | 11/2010 | Summerfelt | ... | H01L 28/20 257/532 |
| 2012/0199942 A1 * | 8/2012 | Kageyama | ... | H01L 23/53228 257/E23.149 |
| 2013/0037909 A1 * | 2/2013 | French | ... | H01L 23/49575 257/532 |
| 2013/0189882 A1 * | 7/2013 | Arimura | ... | H01H 85/0039 439/890 |
| 2013/0214894 A1 * | 8/2013 | Bonilla | ... | H01H 69/02 337/290 |
| 2017/0005046 A1 * | 1/2017 | Sin | ... | H01L 27/0694 |
| 2017/0117217 A1 * | 4/2017 | Tao | ... | H01L 24/46 |
| 2018/0286802 A1 * | 10/2018 | West | ... | H01L 21/768 |
| 2019/0006282 A1 * | 1/2019 | Eid | ... | H01L 23/49838 |
| 2019/0027333 A1 * | 1/2019 | Zhou | ... | H01L 23/66 |
| 2019/0206812 A1 * | 7/2019 | Bonifield | ... | H01L 23/49575 |
| 2019/0287900 A1 * | 9/2019 | Chang | ... | H01H 85/05 |
| 2019/0295965 A1 * | 9/2019 | Fornara | ... | H01H 85/0241 |
| 2020/0126911 A1 * | 4/2020 | Li | ... | H01H 69/022 |
| 2020/0286827 A1 * | 9/2020 | Jiang | ... | H01L 21/322 |
| 2020/0343182 A1 * | 10/2020 | Lin | ... | H10B 12/50 |
| 2021/0020564 A1 * | 1/2021 | West | ... | H01L 23/5227 |
| 2021/0202375 A1 * | 7/2021 | Fowler | ... | H01L 23/5223 |
| 2021/0233844 A1 * | 7/2021 | Li | ... | H01L 23/5256 |
| 2021/0249348 A1 * | 8/2021 | Li | ... | H01L 28/60 |
| 2021/0375542 A1 * | 12/2021 | Diaham | ... | H01G 2/22 |
| 2022/0069066 A1 * | 3/2022 | Bonifield | ... | H01L 27/0292 |
| 2022/0165530 A1 * | 5/2022 | Leng | ... | H01L 23/5256 |
| 2022/0277900 A1 * | 9/2022 | Jeong | ... | H01G 4/232 |

* cited by examiner

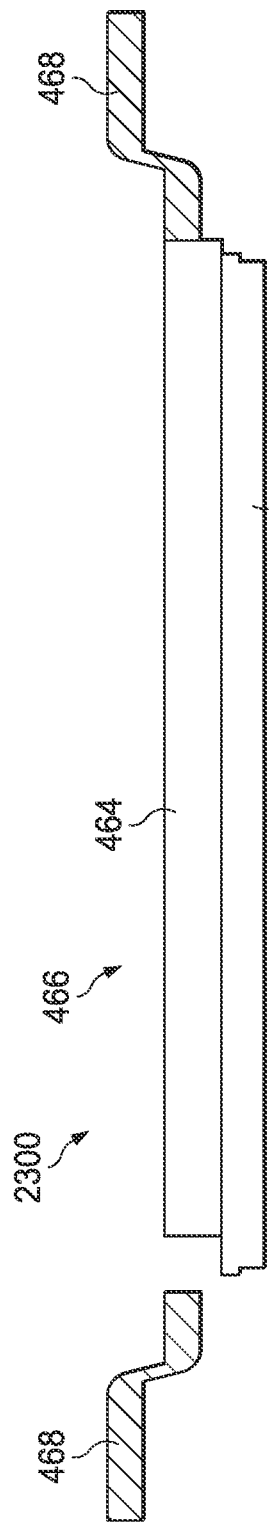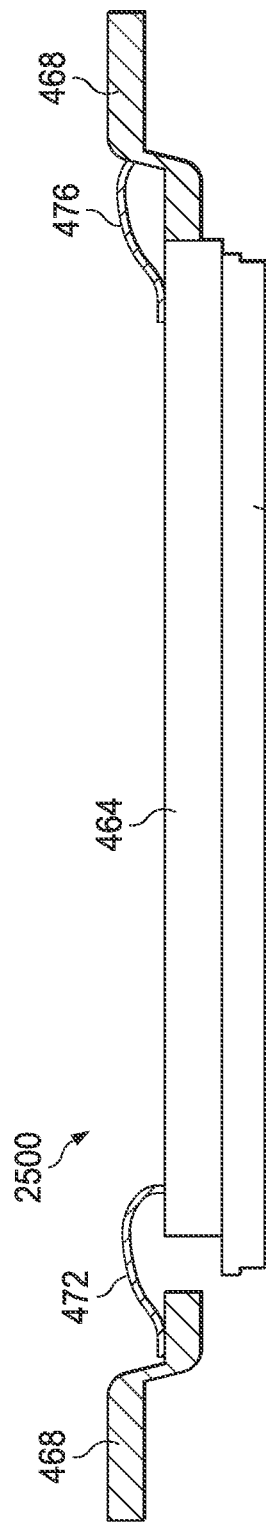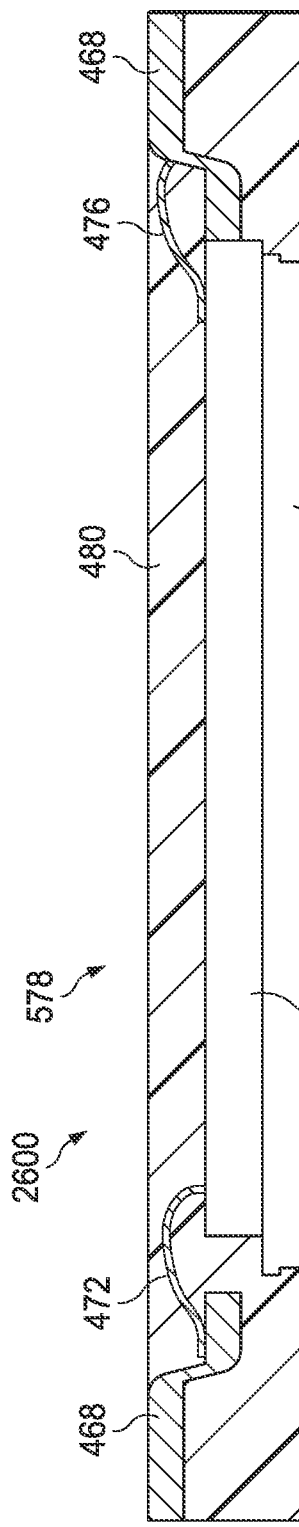

ISOLATION DEVICE WITH SAFETY FUSE

TECHNICAL FIELD

This description relates generally to semiconductor devices and processes, and more specifically, but not exclusively, to an isolator device and methods of forming the same.

BACKGROUND

Isolation is used in electrical circuits to prevent a flow of direct currents and undesirable alternating currents between two parts of a system and also shield high voltage from one part of a system to the other part of a system to prevent electrical shock. While preventing a flow of undesirable currents between parts of a system, isolation may allow signal transfer between the isolated parts of the system. Isolation can be provided by integrated circuits (ICs) referred to as isolators. Isolators may be included in electronic systems for safety reasons and/or to protect electronic components of the systems. For example, where two systems need to communicate, but the two systems may have different potentials, communication may be through an isolator but allows no current flow between two systems with different voltages. Various types of isolators may include optical coupling, capacitive coupling, inductive coupling, or other types of coupling.

SUMMARY

In an example, a semiconductor device can include first and second conductive layers that can be positioned over a substrate, and at least one dielectric layer between the first and second conductive layers. The at least one dielectric layer can be positioned over at least a portion of the second conductive layer, and the first conductive layer can be positioned over a portion of the least one dielectric layer. The semiconductor device can further include a third conductive layer that can be positioned over the substrate and can be conductively connected to the second conductive layer and the substrate. The third conductive layer includes a fusible link.

In another example, a method of forming an IC can include forming first and second electrodes of a reactive device over a substrate, and forming an interconnect network that can conductively couple the first electrode to the substrate and to a first terminal of a fusible link. The first and second electrodes can be separated by a dielectric layer.

In a further example, an IC can include upper and lower electrodes located over a substrate, and separated by a dielectric layer. The lower electrode can be located directly between the upper electrode and the substrate. The IC can further include an interconnect network that can conductively connect the lower electrode to the substrate and to a first terminal of a fusible link.

BRIEF DESCRIPTION OF THE DRAWINGS

FIGS. 4-26 is an example of a process flow for fabricating a semiconductor isolator device with a fuse.

DETAILED DESCRIPTION

Figure 1:
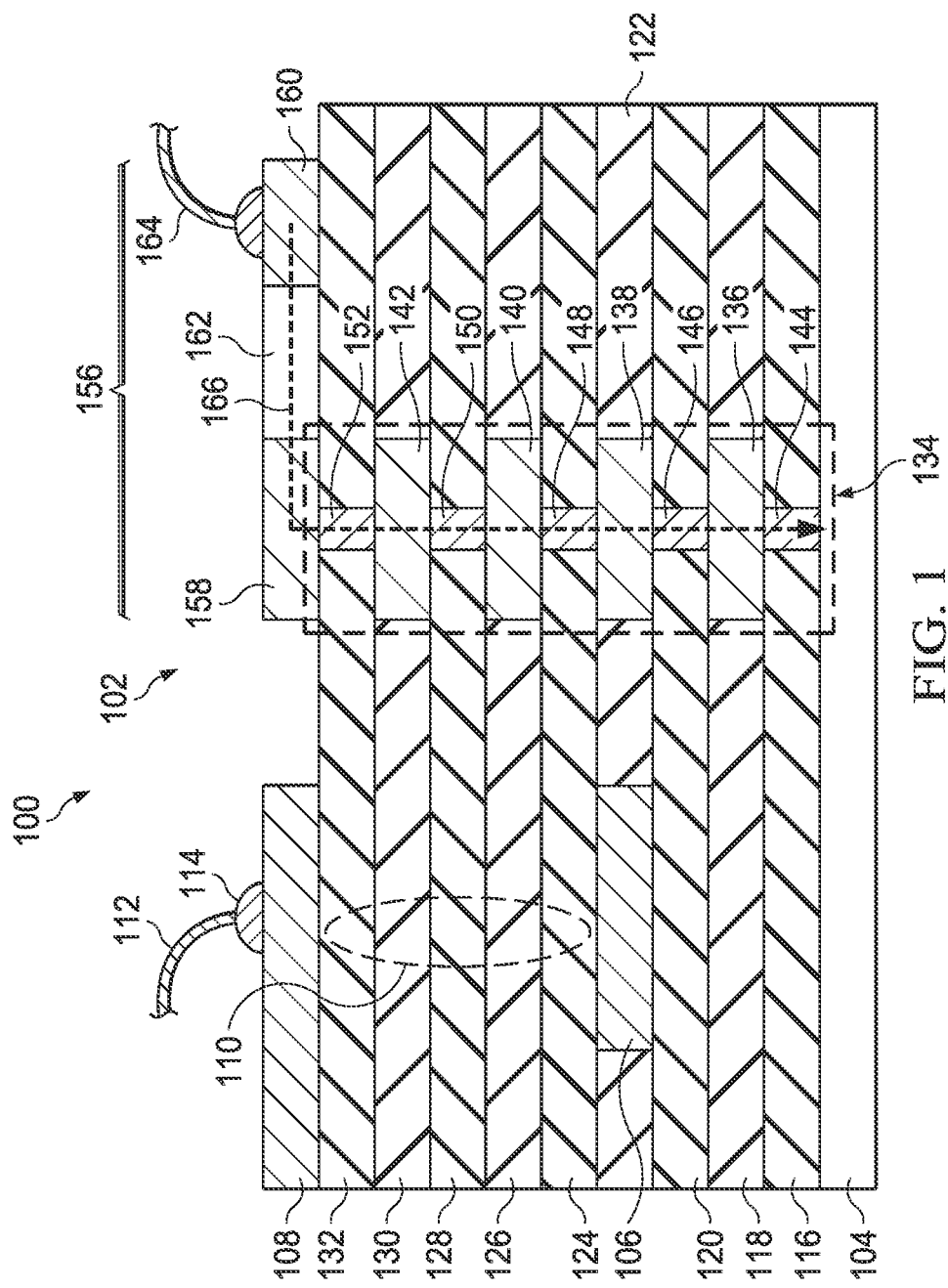
FIG. 1 is an example of a cross-sectional view of a semiconductor isolator device with a fuse.

This description relates generally to isolator devices. Isolator devices are packaged ICs with capacitors for isolating different devices, such as a low voltage device (e.g., a processor) and a high voltage device (e.g., a gate driver). Capacitors used in isolator devices can be referred to as isolation capacitors. Isolator devices generally include a lead frame and one or more dies. Input and output bond pads of the one or more dies can be attached to conductive leads of the lead frame using a respective bond wire, thereby coupling the one or more dies therein to one of the low and high voltage devices. The one or more dies can include an isolation capacitor, which can function as a safety capacitor, and thus protect a user (e.g., a human) on a low voltage side from excessive shocks on a high voltage side, such as lightning, high voltage electrostatic discharge (ESD) or excessive operation stress (EOS) events. However, another kind of EOS event can occur on the low voltage side between input pins and ground pins. During such an EOS event, for example, the low voltage device can have a voltage that is greater than its rated voltage and cause a circuit failure, which can cause the isolator device to receive excessive current from the low voltage device that is greater than an acceptable (or rated) amount for the isolator device. The excessive current can overheat the isolator device, which can lead to damage to the isolation capacitor by causing dielectric layers of the isolation capacitor to crack, thereby degrading the isolation capability of the isolation capacitor. If the isolation capability is sufficiently degraded, and the user comes into contact with the isolator device from the low voltage side during excessive shock events such as lightning, high voltage ESD, or EOS on the high voltage side, the excessive current can flow to the user and shock the user, which in some instances leads to a loss of human life.

According to the examples herein, a semiconductor isolator device can be fabricated with a safety fuse to provide isolation capacitor protection to mitigate isolation capacitor degradation during an EOS event. The semiconductor isolator device as described herein can be coupled to a first device (e.g., a low voltage device) and a second device (e.g., a high voltage device) and galvanically isolate the first and second devices via one or more isolation capacitors. In some examples, the safety fuse is formed in a current path on an input conductive lead of the semiconductor isolator device. For example, the safety fuse can be formed in the current path between an input conductive lead and a ground conductive lead of a lead frame assembly of the semiconductor isolator device. A portion of the current path can be formed of conductive layers of the semiconductor isolator device through which a current received at the input conductive lead can flow through the semiconductor isolator device and make the device functional.

In some examples, a portion of a respective conductive layer of the conductive layers is etched according to a fuse pattern to form a current crowding portion corresponding to the safety fuse. The term "current crowding portion" as used herein can refer to a portion of a conductive layer that is connected to a terminal portion and when conducting current has a greater current density than does the terminal portion. Thus, the portion of the respective conductive layer can be etched based on the fuse pattern to form a current crowding area therein and can have a greater current density than non-etched portions of the respective conductive layer.

Without implied limitation, an example of a current crowding portion is the narrow neck portion of a "dog bone" style fusible link, the neck portion having a constant width and spanning a nonzero distance between two wider terminal portions.

In some examples, the respective conductive layer (or a portion thereof) is representative of an input current bonding pad of the semiconductor isolator device, and thus the fuse can be formed in a portion of the bonding pad. By forming the fuse in the portion of the bonding pad, the fuse can reduce or eliminate degradation of the isolation capacitor during the EOS event as the excessive current would flow through the fuse and cause fusion (e.g., melting of the use) before flowing to the isolation capacitor since a current density is higher at the safety fuse. The high current density during an EOS event can melt the safety fuse and lead the safety fuse to become open and cutting off a current flow path. As such, the etched portion of the respective conductive layer that can be representative of the fuse can reduce or restrict an amount of current that can flow through the isolator die. Thus, the fuse can limit a maximum current flow into the semiconductor isolator device, such that excessive current provided by the first device during the EOS event does not degrade the isolation capacitor, which can lead to a shock of the user. In some examples, the safety fuse is a poly fuse, a contact fuse, or a metal fuse.

Examples are described herein wherein a fuse is used isolator devices to limit an input current to an isolator device, such as during an EOS event. However, the examples herein should not be construed and/or limited to only such devices. The fuse can be used in any semiconductor device for restricting (or limiting) current that can be received by the semiconductor device or flow within the semiconductor device (e.g., between conductive layers).

FIG. 1 is an example of a cross-sectional view of an integrated circuit (IC) 100, e.g. a semiconductor isolator device. Without implied limitation additional aspects of the IC 100 may be provided by U.S. Patent Application No. 2019/0378892 ("the '892 application"), incorporated herein by reference in its entirety. In some examples the IC 100 is implemented using a five-metal-level interconnect system, and shown while other examples are implemented in a six-metal-level interconnect system. The IC 100 can include a lead frame assembly (not shown) for mounting an isolator die 102, which can be encapsulated in a molding compound. For clarity and brevity purposes, the lead frame assembly and the molding compound of the IC 100 have been omitted. In some other examples, the package may be a multi-chip module (MCM) small outline integrated circuit (SOIC) package. In other examples, a different package can be used for packaging the isolator die 102. Thus, while examples are presented herein wherein a single isolator die is attached to the lead frame, in other examples, one or more dies that include the isolator die 102 can be attached to the lead frame and encapsulated in a single package.

The isolator die 102 includes a substrate 104. In some examples, the substrate 104 includes a polysilicon or other conductive material in the form of a gate electrode of a transistor. In some examples, the substrate 104 includes silicon, or another semiconductor material such as gallium arsenide, or an epitaxial layer of semiconductor material, and may have various components, for example, metal-oxide-silicon (MOS) transistors, diodes, field effect transistors (FETs), bipolar transistors, resistors and capacitors formed within it. The isolator die 102 can include a lower metal layer 106 and an upper metal layer 108. The lower metal layer 106 and the upper metal layer 108 are terminals of a device in which the lower metal layer 106 and the upper metal layer 108 may be reactively coupled when excited by an AC signal. In some examples, the upper metal layer 108 is representative of a top electrode of a parallel plate capacitor 110 and the lower metal layer 106 is representative of a bottom electrode of the capacitor 110. In other examples, the upper metal layer 108 may represent a top electrode of an inductor, and the lower metal layer 106 is representative of a bottom electrode of the inductor. Without implied limitation, the following description refers to the capacitor example.

The capacitor 110 can function as a safety circuit element by providing DC isolation between circuits connected to the upper metal layer 108 and circuits connected to the lower metal layer 106, and thus protect a user (e.g., a human) from excessive shock, such as from high voltage ESD or a circuit operating at high voltage. In some examples, the upper metal layer 108 also functions as a bond pad for bonding a wire 112. A first end of the wire 112 can be bonded to the upper metal layer 108 by a ball bond 114. A second end of the wire 112 can be bonded to a respective conductive package terminal, e.g. a lead of a lead frame assembly. In some examples, the respective conductive lead is coupled to a first device, for example, a high voltage device (e.g., a semiconductor driver device). Thus, in some examples, the capacitor 110 is referred to as a high-voltage (side) capacitor. In other examples, the second end of the wire 112 is bonded to another bond pad on another die located within a same package as the isolator die 102, or to another isolation device.

As shown in FIG. 1, the isolator die 102 can include dielectric layers 7 including a PMD layer (pre-metal dielectric) 116, IMD (intra-metal dielectric) layers 118, 122, 126, and 130, and ILD (inter-level dielectric) layers 120, 124, 128 and 132. Thus, in some examples, ILD and IMD layers can be arranged in an alternating pattern between the metal layers 106 and 108 to form the capacitor 110. A number of dielectric layers between the metal layers 106 and 108 can define a thickness of a total dielectric for a respective capacitance value. Thus, a dielectric thickness of the capacitor 110 can correspond to a breakdown voltage of the capacitor 110. As shown in the example of FIG. 1, the ILD layer 132 overlies the IMD layer 130, which overlies the ILD layer 128. The ILD layer 128 overlies the IMD layer 126 and this layer overlies the ILD layer 124, as shown in FIG. 1. While the example of FIG. 1 shows five dielectric layers defining the dielectric thickness of the capacitor 110, in other examples, more or less than five dielectric layers may be used, which can be a combination of ILD and/or IMD layers. As shown in FIG. 1, between the capacitor 110 and the substrate 104, additional dielectric layers are positioned, including the PMD layer 116, the IMD 118, and the ILD 120.

In the illustrated example, a metal stack 134 is connected between the substrate 104 and a fuse 156. The metal stack 134 includes metal stack layers 136, 138, 140, and 142, which may be referred to as respectively being located at MET1, MET2, MET3 and MET4 levels, while the top metal level may be referred to as the MET5 level. In some examples, the lower metal layer 106 and the metal stack layer 138 are connected by an interconnection (not shown) at the same metal level. The metal stack 134 is also electrically connected to the lower metal layer 106 by an interconnection (not shown) that can be at any metal level. As described in greater detail below with respect to FIG. 2, the fuse 156 includes a first fuse head 158, a second fuse head 160, and a current crowding portion 162. In the illustrated example the fuse 156 is located at the same level as the upper metal layer 108, and the first fuse head is connected to the fifth via 152. While the fuse 156 may be located at any metal level, in the illustrated example the fuse 156, or a portion thereof such as the second fuse head 160, can also function as a bond pad at the top metal level connected to a wire 164.

To provide electrical continuity from the substrate to the fuse 156 the metal stack 134 includes vias 144, 146, 148, 150, and 152 located at corresponding VIA1, VIA2, VIA3 and VIA4 levels. In examples in which the IC 100 is implemented in an aluminum interconnect system, the vias 144, 146, 148, 150, and 152 may be formed of tungsten or another suitable metal. In examples in which the IC 100 is implemented using a copper interconnect system, the vias and metal levels may be copper formed by a damascene or dual-damascene process. In some examples, the via 144 lands on a transistor gate in the substrate 104, in which case the via 146 may be referred to as a transistor contact. While the metal stack 134 is shown as a vertically stacked combination of metal layers and vias in which the MET1, MET2, MET3, and MET4 portions directly overlie or underlie each other, in various examples the metal stack 134 may be an interconnection network that includes an arbitrary combination of metal layers and vias to form a conductive path from the substrate 104 and the fuse 156, and from the lower metal layer 106 and the fuse 156.

Because the metal stack 134 enables current to flow between the substrate 104 and the fuse 156, current may flow in some circumstances between the wire 164 and the substrate 104 by way of a current path 166. An amount of current that can be carried along the current path 166 can be limited by a maximum current density that can be supported by the fuse 156. Thus, a current density of current flowing along the current path 166 can be a function of a current flow area corresponding to a respective minimum cross-sectional area of a conductor in the current path 166, e.g., the current crowding portion 162.

In some examples, during operation excess current may flow through the metal stack 134. For example, a transistor gate oxide in the substrate 104 may fail, e.g. by an ESD or EOS event, causing a low-resistance path to a grounded circuit node or a silicon substrate. In the absence of the fuse 156 energy may be transferred to the isolator die 102 that heats the substrate or interconnect layers sufficiently to cause damage such as cracks that may propagate into the capacitor 110. Such cracks may cause a low-resistance path between the upper metal layer 108 and the lower metal layer 106, compromising the ability of the isolator die 102 to protect a person who may come in contact with the IC 100 or with other devices intended to be isolated from high voltage by the isolator die 102.

However, the fuse 156 may provide backup isolation by fusing in the event of such an excess current event. The fuse 156 may be configured to support a current density that is representative of a maximum current flow through the capacitor 110 under intended operating conditions. But the current crowding portion 162 of the fuse 156 is configured such that in an excess current event the current density through the current crowding portion 162 exceeds the allowed maximum current, causing localized heating that fuses the current crowding portion, isolating the first fuse head 158 from the second fuse head 160, thus ensuring high voltage is not coupled between the wire 112 and the wire 164. In view of this operation, the fuse 156 may be referred to as a safety fuse. As described previously, the fuse 156 may be implemented alternatively in any metal layer or via layer, or in a polysilicon layer (not shown) of the substrate 104.

For examples in which the fuse is implemented in a polysilicon layer, such layer can be doped with any suitable n-type or p-type impurities or can be undoped. For examples in which the fuse is implemented in a via layer, the current crowding portion may be implemented by a smaller number of vias in one via level relative to other via levels.

Figure 2:
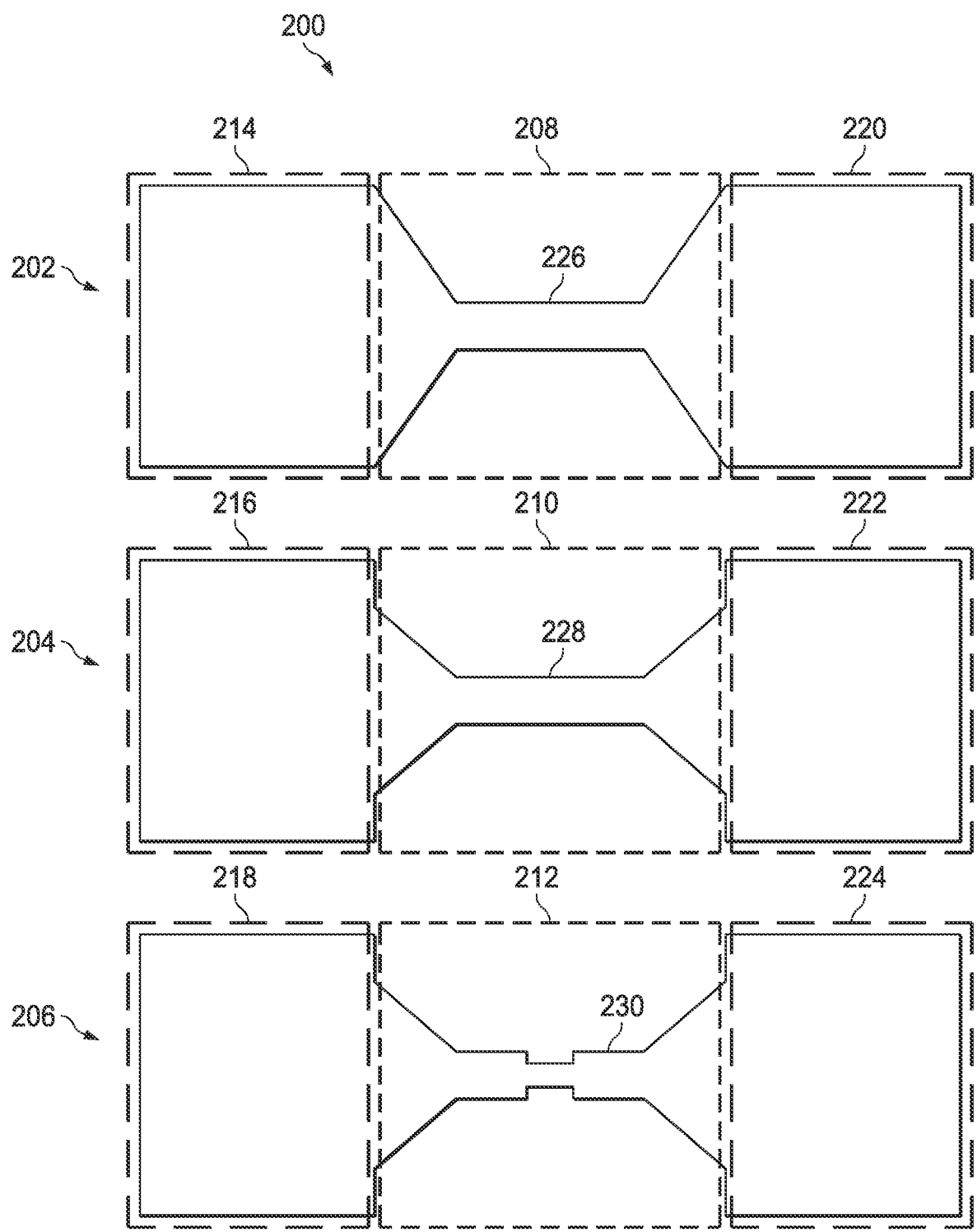
FIG. 2 is an example of etched conductive layers representative of various fuse shapes.

FIG. 2 is a top view of three example fuses 202, 204, and 206 that may serve as the fuse 156 (FIG. 1). Each of the fuses 202, 204, and 206 has a thin body portion between two taper portions that transition to each of two corresponding head portions. For example, the fuse 202 has a body portion 226 between head portions 214 and 220, the fuse 204 has a body portion 228 between head portions 216 and 222, and the fuse 206 has a body portion 230 between head portions 215 and 224. The body portions 226, 228, and 230 may sometimes be referred to as fusible links, and the head portions may sometimes be referred to as terminals of the respective fuses. Current flowing through one of the fuses 202, 204 and 206 is thus crowded in the body portion and taper portions relative to the head portions, and thus the body portion and taper portions may be collectively referred to sometimes as a current crowding portion, exemplified by current crowding portions 208, 210 and 212. By reducing a current flow cross-sectional area within the respective current crowding portion of each fuse 202, 204, and 206, current crowding can lead to localized, melting and/or and vaporization at the respective body portions 226, 228, and 230, such as during an EOS or ESD event, as described herein.

The fuse 202 illustrates an example in which the taper portions have a maximum width equal to the head portions 214 and 220, and the body portion 226 has a uniform cross-sectional area between the taper portions. The fuse 204 illustrates an example in which the taper portions have a maximum width smaller than the head portions 216 and 222, and the body portion 228 has a uniform cross-sectional area between the taper portions. The fuse 206 illustrates an example in which the taper portions have a maximum width smaller than the head portions 218 and 224, and the body portion 230 includes a notch, resulting in a portion of the body portion 230 having a first cross-sectional area and a portion having a second smaller cross-sectional area.

Figure 3:
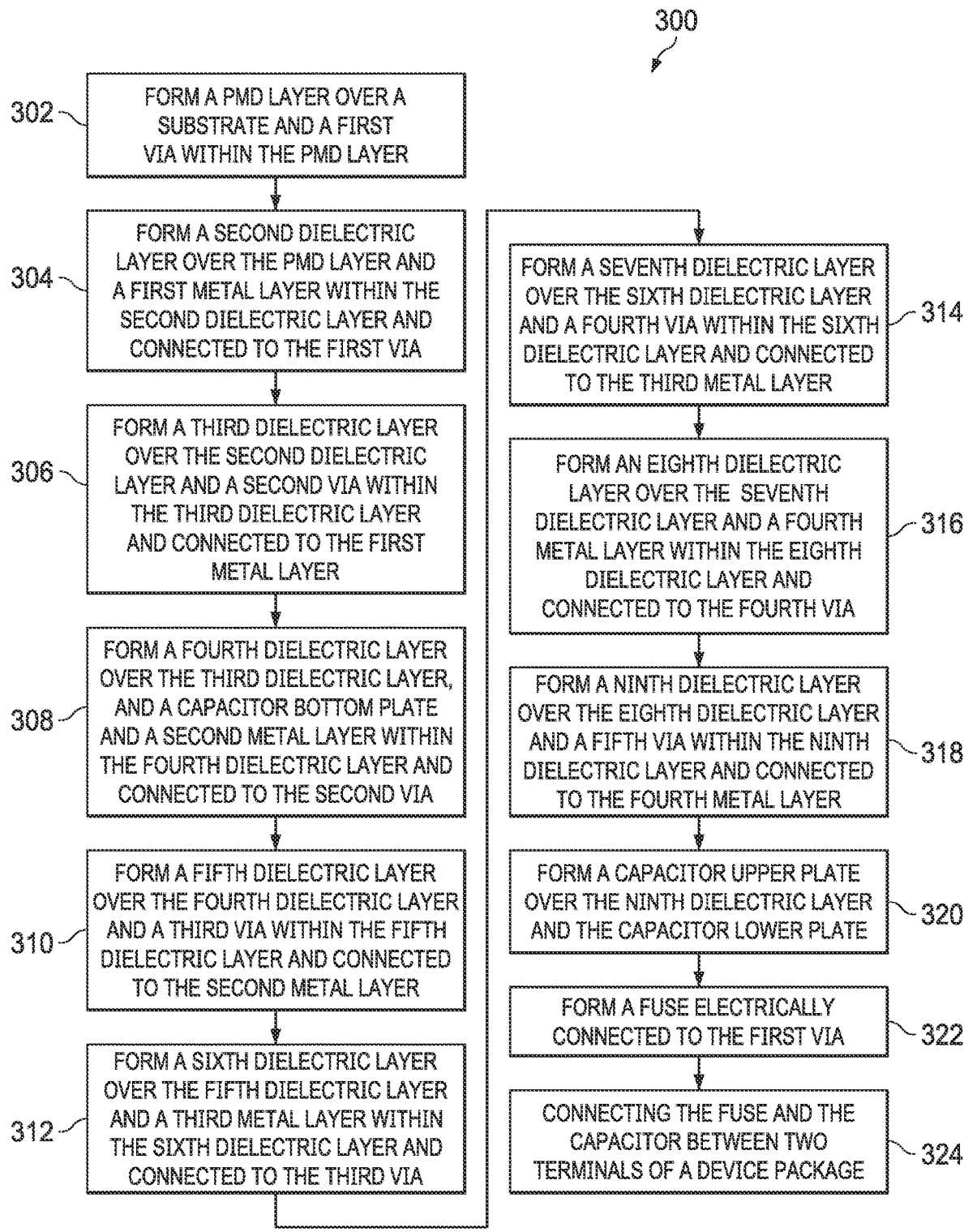
FIG. 3 is an example of a method of forming a semiconductor isolator device.

FIG. 3 is an example of a method 300 of forming an integrated circuit including a semiconductor isolator device such as the IC 100, as shown in FIG. 1, e.g. using a 5-level metallization process. Thus, reference can be made to the example of FIGS. 1-2 in the example of FIG. 3. Additional details of forming one suitable example isolator device is provided by the '892 application. The method 300 can begin at 302 by forming a first dielectric layer (e.g., PMD layer 116, FIG. 1) over a substrate (e.g., the substrate 104, FIG. 1). At 302, a first via, or contact (e.g., via 144, FIG. 1) may also be formed within the first dielectric layer and connected to a gate electrode layer in an underlying substrate. At 304, forming a second dielectric layer (e.g. IMD1 118, FIG. 1) over the first dielectric layer, and forming a metal layer (e.g. MET1 136, FIG. 1) within the second dielectric layer and connected to the first via. At 306, forming a third dielectric layer (e.g. ILD1 132, FIG. 1) over the second dielectric first layer, and a second via (e.g. via 146, FIG. 1) within the third dielectric layer and connected to the first metal layer.

At 308 a fourth dielectric layer (e.g. IMD2 122, FIG. 1) is formed over the third dielectric layer. A second metal layer (e.g. MET2 138, FIG. 1) and a capacitor bottom plate (e.g. lower metal layer 106, FIG. 1) are formed within the fourth dielectric layer. The second metal layer is electrically connected to the second via, and to the capacitor bottom plate within the fourth dielectric layer. At 310 a fifth dielectric layer (e.g., ILD 124, FIG. 1) is formed over the fourth dielectric layer, and a third via (e.g. via 148, FIG. 1) is formed within the fifth dielectric layer and electrically connected to the second metal layer. At 312, forming a sixth dielectric layer (e.g. IMD3 126, FIG. 1), and forming a third metal layer (e.g. MET3 140, FIG. 1) within the sixth dielectric layer and electrically connected to the third via. At 314 a seventh dielectric layer (e.g., ILD3 layer 128, FIG. 1) is formed over the sixth dielectric layer, and a fourth via (e.g. via 150, FIG. 1) is formed within the seventh dielectric layer and connected to the third metal layer. At 316, forming an eighth dielectric layer (e.g. IMD4 130, FIG. 1), and forming a metal layer (e.g. MET4 142, FIG. 1) within the eighth dielectric layer and connected to the fourth via. At 318 a ninth dielectric layer (e.g., ILD4 layer 132, FIG. 1) is formed over the eighth dielectric layer, and a fifth via (e.g. via 152, FIG. 1) is formed within the ninth dielectric layer and connected to the fourth metal layer.

At 320, forming a capacitor top plate (e.g. top plate 108, FIG. 1) in a fifth metal level over the ninth dielectric layer and over the capacitor bottom plate. At 322, forming a fuse (e.g. fuse 164) over the and electrically connected to the first via. In one example the fuse is formed concurrently with step 320 at the same metal level as the capacitor top plate, but in other examples, the fuse may be formed at any other metal or gate electrode level. When formed at a top-level metal such as the fifth metal level, portions of the fuse may serve as interconnection terminals or bond pads. For example, the first fuse head 214 of the fuse 202 (FIG. 2) may be electrically connected to the fifth via, and the second fuse head portion 220 may serve as a bond pad, for example, to which the wire 164 (FIG. 1) is attached. Forming the fuse includes forming a corresponding body portion (e.g. body portion 226, FIG. 2). At 324 the fuse and the capacitor are connected between two terminals of a device package and sealed within the package.

In the method 300, vias and metal layers (including the bottom and top plates and the fuse) may be formed by any suitable process. One such process includes aluminum metal layers, formed by subtractive etch, joined by tungsten vias formed by via fill and CMP. Another suitable process includes forming copper metal layers and vias by a damascene or double-damascene process. The scope of the disclosure includes future-developed metallization processes that are otherwise consistent with the disclosure. Furthermore, while illustrated as a 5-level metal process, the integrated circuit may include any number of metallization levels consistent with forming the capacitor 110, for example, a 6-level metal process.

Figure 4:
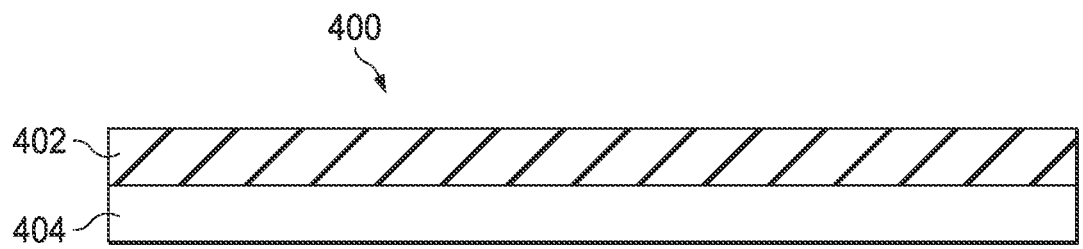
Figure 5:
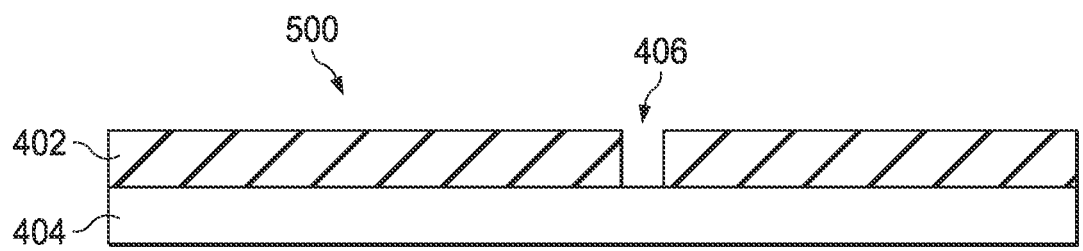

FIGS. 4-26 show stages of a method for fabricating a semiconductor isolator device, such as the IC 100, as shown in FIG. 1. Thus, reference can be made to the example of FIG. 1 in the example of FIGS. 4-26. Without implied limitation, additional aspects are described in the '892 application for the specific implementation of a 5-level aluminum metallization process. As shown in FIG. 4, at 400, a PMD layer 402 (e.g. the PMD layer 116, FIG. 1), such as a silicon oxide-base dielectric, can be formed over a substrate 404. In some examples, the substrate includes a gate electrode layer. As an example, the substrate 404 may include a polysilicon layer that resides over a MOS transistor. In some examples, at 400, chemical-mechanical polishing (CMP) can be applied to a surface of the PMD layer 402 to planarize the surface of the PMD layer 402. As shown in FIG. 5, at 500, the PMD layer 402 can be etched to form a first opening 406.

Figure 6:
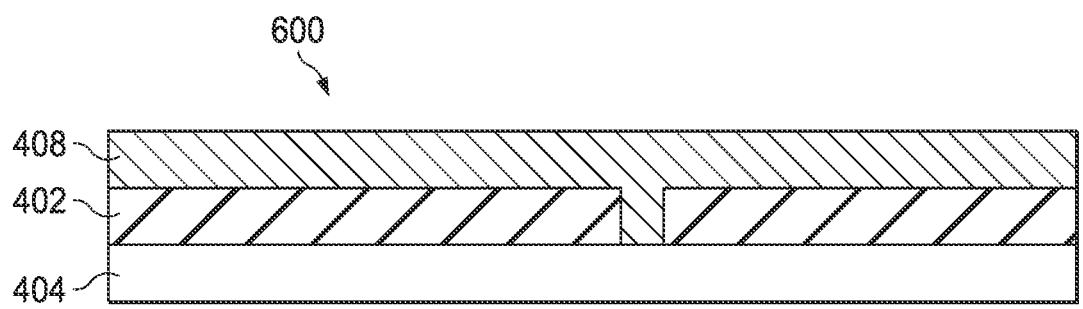
Figure 7:
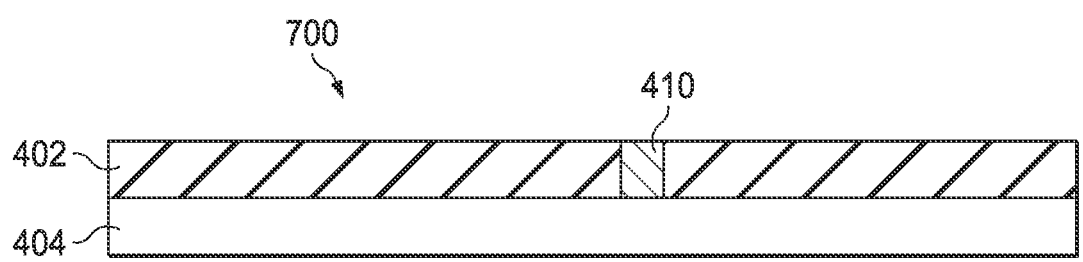

At 600, as shown in FIG. 6, a first metal layer 408 can be deposited over the PMD layer 402. The first metal layer 408 can fill the first opening 406 to form a first via 410 therein. In some examples, the first metal layer 408 is tungsten. Throughout this description via-fill metal may be described without implied limitation as tungsten while recognizing that other suitable transition metals may be used in addition or in the alternative. At 700, the first metal layer 408 is polished by CMP to remove the tungsten layer outside the opening 406, so as to result in the structure, as shown in FIG. 7. For example, CMP can be applied to the tungsten layer 408 to strip away the tungsten layer 408 overlaying the PMD layer 402 while leaving the first via 410.

Figure 8:
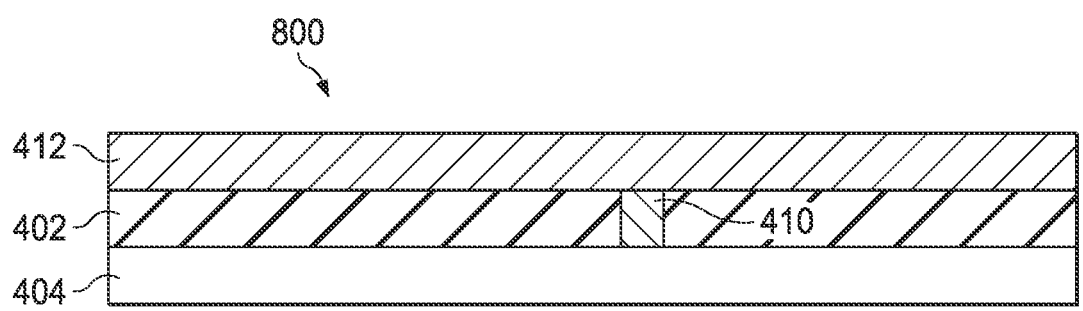
Figure 9:
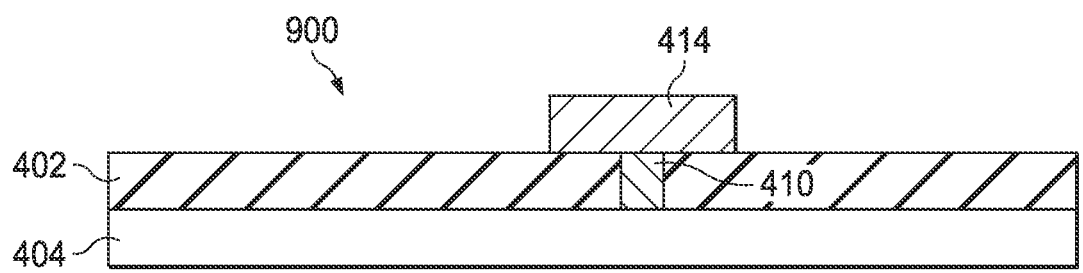
Figure 10:
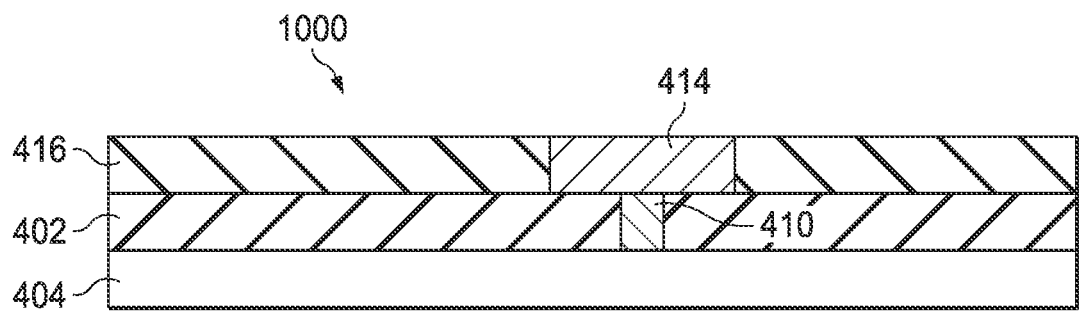
Figure 11:
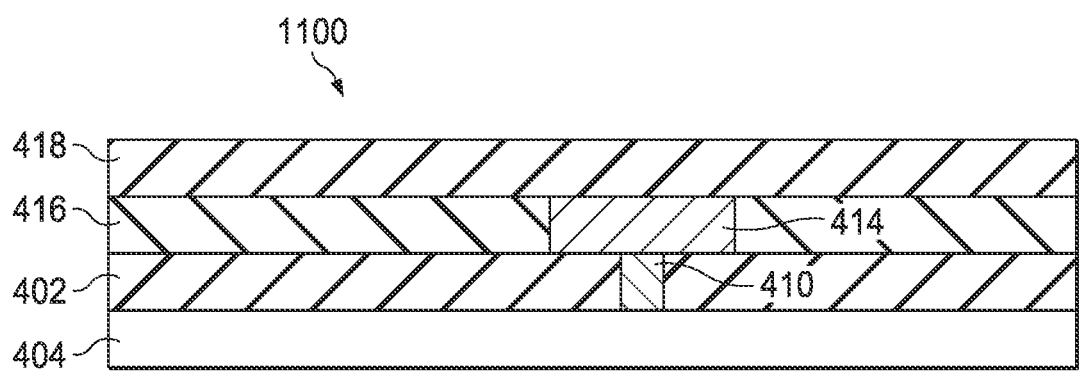
Figure 12:
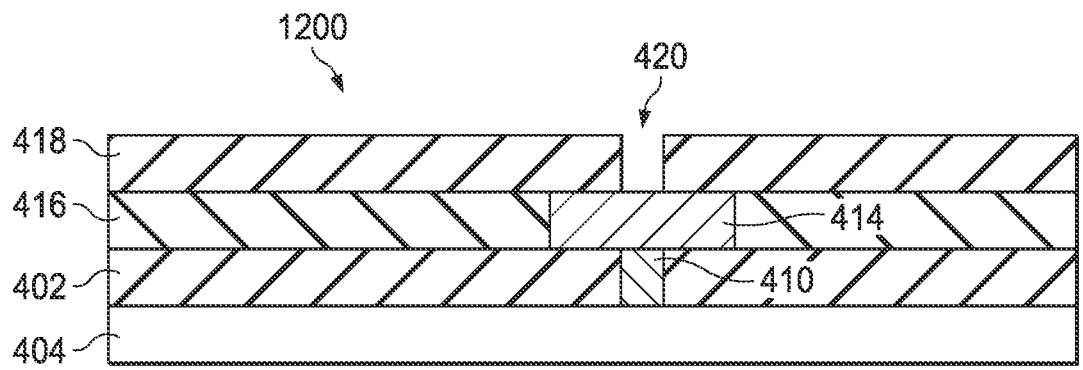

As shown in FIG. 8, at 800, a first metal layer 412 is deposited over the PMD layer 402. The first metal layer 412 is etched at 900 to provide a first metal layer portion 414, so as to result in the structure, as shown in FIG. 9. As shown in FIG. 10, at 1000, a first IMD layer 416 is deposited over the first metal layer portion 414 and exposed portions of the PMD 402. In some examples, as shown in FIG. 11, at 1100, a first ILD layer 418, e.g. including silicon oxide, is deposited over the first IMD layer 416. In some examples, at 1100, CMP is applied to a surface of the first ILD layer 418 to planarize the surface of the first ILD layer 418. As shown in FIG. 12, at 1200, the first ILD layer 418 can be etched to form a second opening 420 in the first ILD layer 418.

Figure 13:
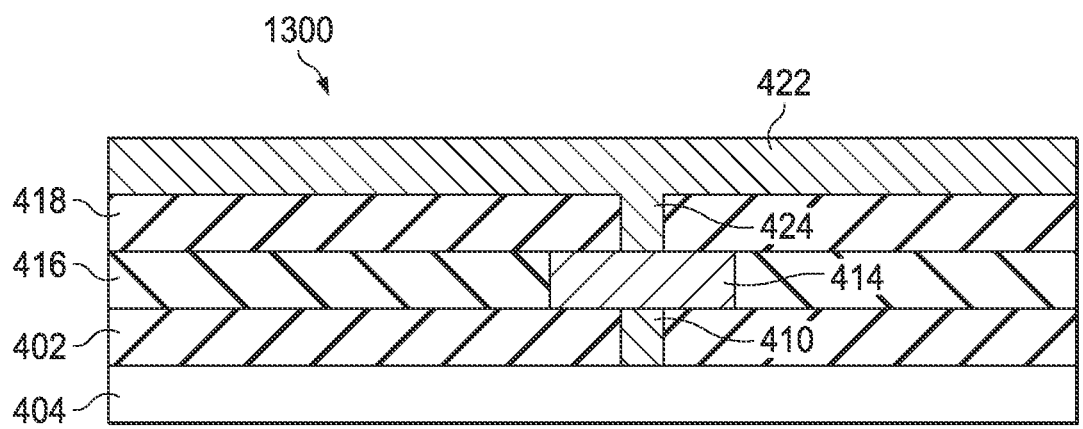
Figure 14:
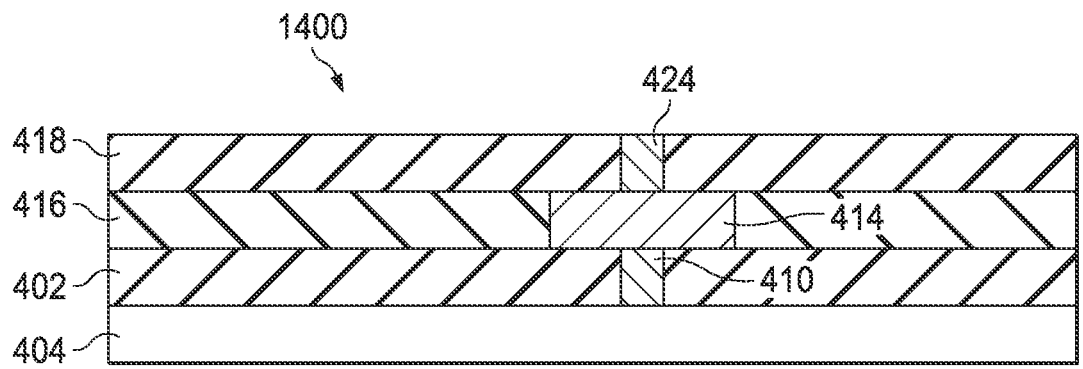
Figure 15:
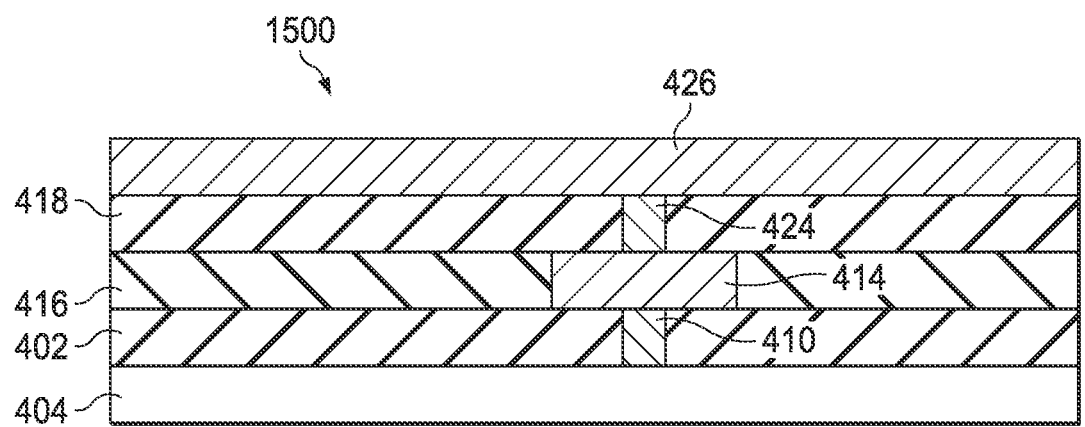
Figure 16:
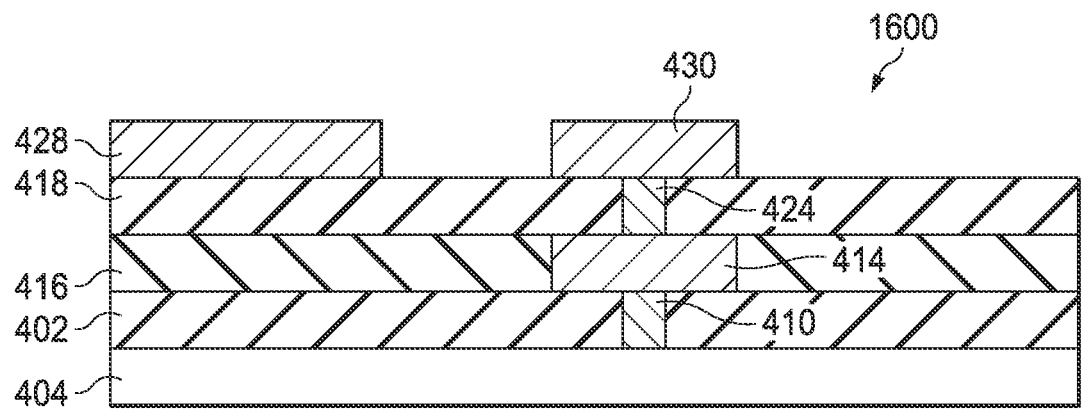
Figure 17:
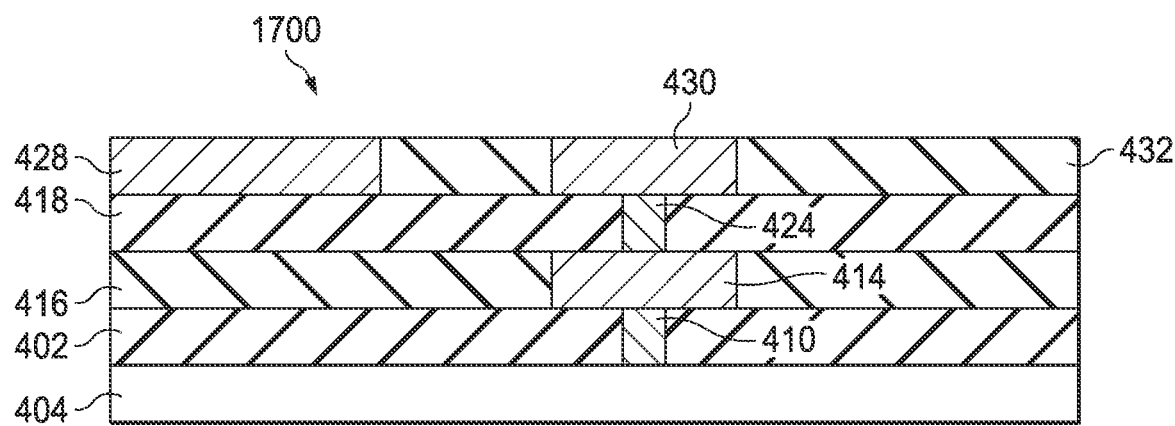

At 1300, as shown in FIG. 13, a second tungsten layer 422 can be deposited over the first ILD layer 418. The tungsten layer 422 can fill the second opening 420 to form a second via 424 therein. As shown in FIG. 14, at 1400, the tungsten layer 422 overlying the first ILD layer 418 can be polished so as to result in the structure as shown in FIG. 14. For example, CMP is applied to the tungsten layer 422 to strip away the tungsten layer 422 overlying the first ILD layer 418 while leaving the second via 424. As shown in FIG. 15, at 1500, a second metal layer 426 can be deposited over the first ILD layer 418. In some examples, at 1600, the second metal layer 426 is etched to form a capacitor bottom plate 428 and a second metal portion 430, so as to result in the structure, as shown in FIG. 16. In some examples, at 1700, a second IMD layer 432 is deposited over exposed portions of the first ILD layer 418, so as to result in the structure, as shown in FIG. 17.

Figure 18:
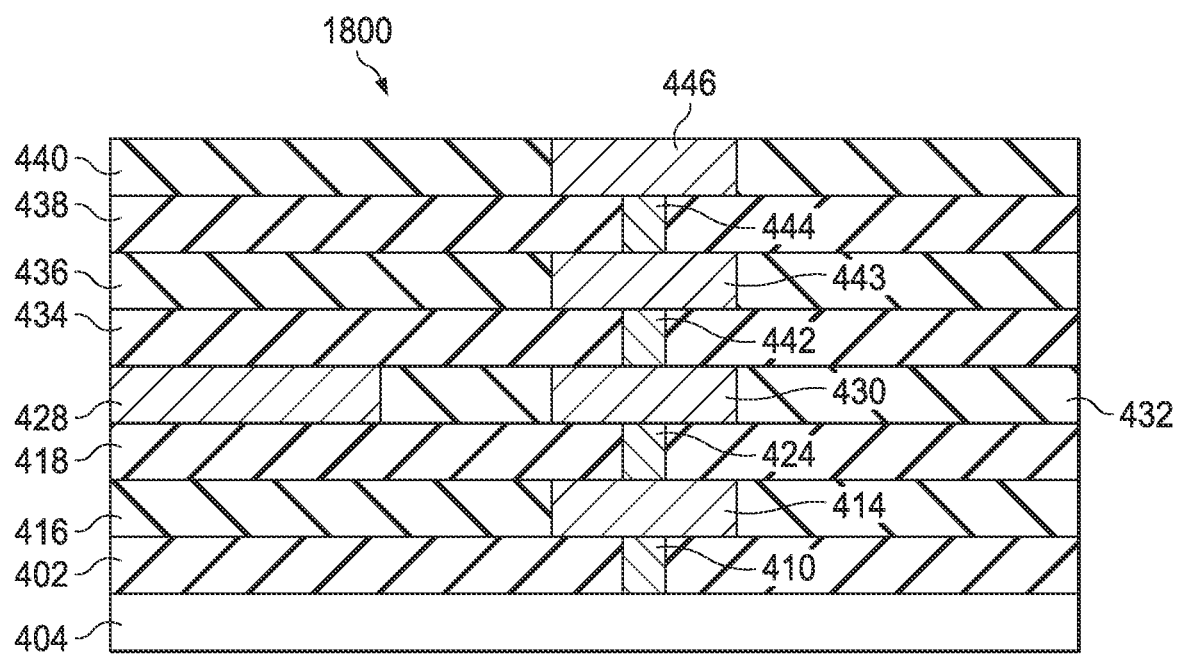

In some examples, at 1800, during fabrication, steps 400-1000, are repeated, so as to result in a structure as shown in FIG. 18. A number of times that the steps 400-1000 are repeated can be based on a capacitance for the semiconductor isolator device, and thus an application of the semiconductor isolator device. Thus, in some examples, during fabrication, a second ILD layer 434 is formed over the second dielectric layer 232, the lower capacitor plate 428 and the second metal layer portion 430. In some examples, during the fabrication, a second ILD layer 436 is formed over the second ILD layer 434. In further examples, during the fabrication, a fourth ILD layer 438 is formed over the second ILD layer 436, and a fourth IMD layer 440 can be formed over the fourth ILD layer 438. As shown, at 1800, during the fabrication, within the second ILD layer 434, a third via 442 can be formed, and within the fourth ILD layer 438 a fourth via 444 can be formed. Moreover, during the fabrication, within the third IMD layer 436 and the fourth IMD layer 438 respective third and fourth metal layer portions 443 and 446 can be formed, so as to result in the structure, as shown in FIG. 18.

Figure 19:
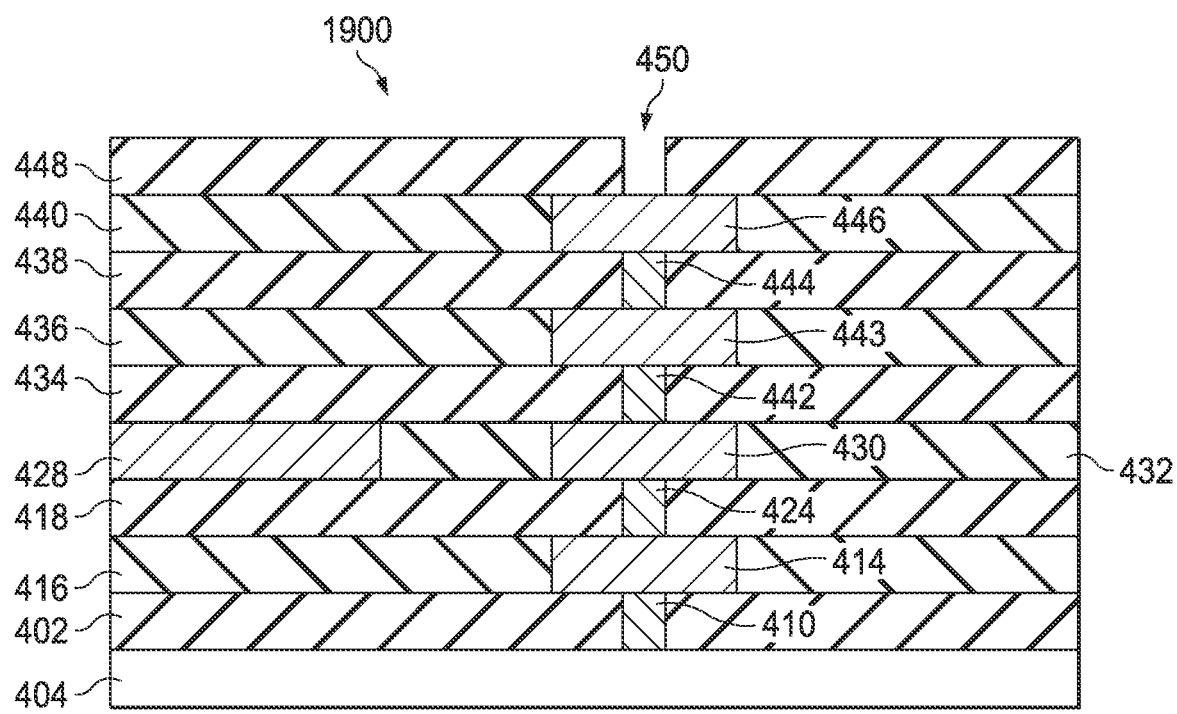
Figure 20:
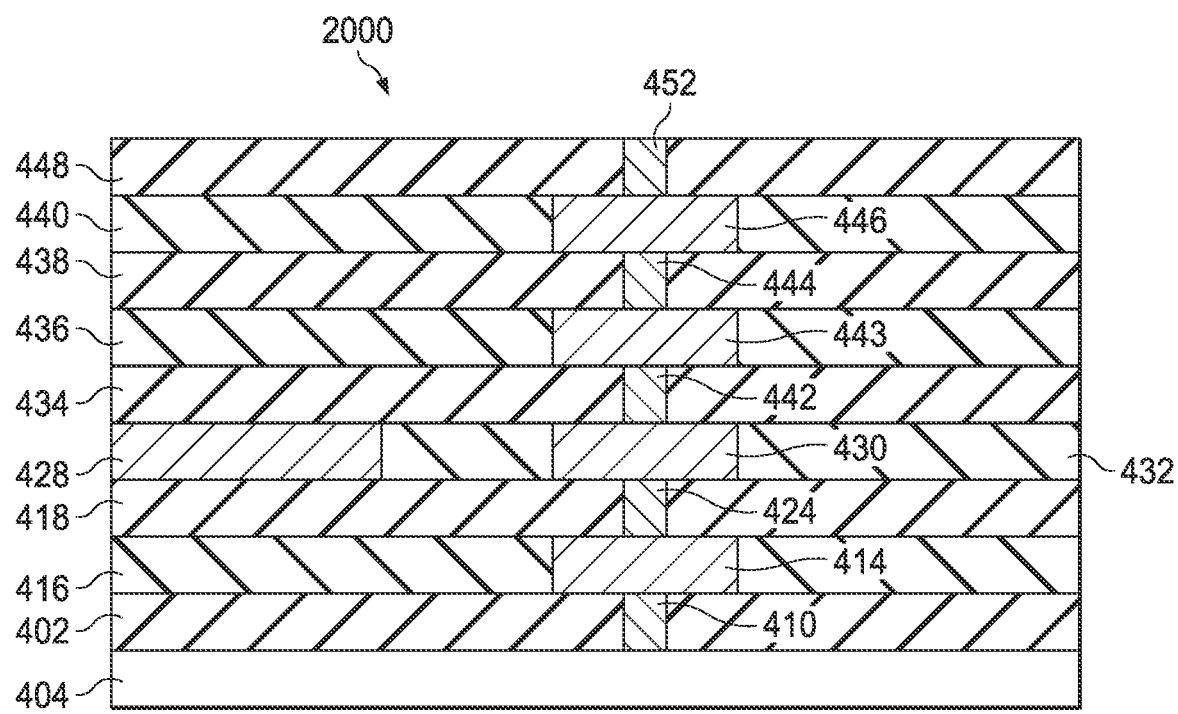
Figure 21:
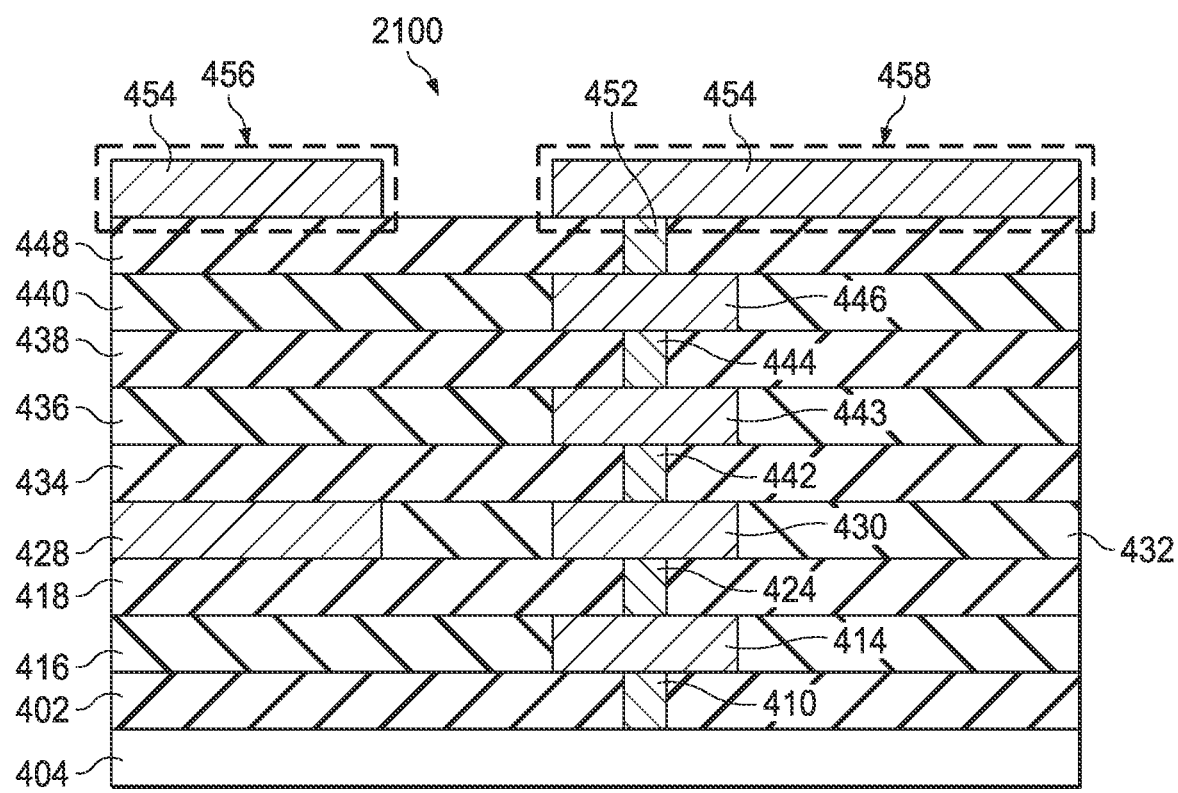

In some examples, at 1900, as shown in FIG. 19, a fifth ILD layer 448 is deposited and etched to form a third opening 450. At 2000, steps 600-700 can be repeated, so as to result in the structure, as shown in FIG. 20. As such, a fifth via 452 can be formed in the third opening 450, as shown in FIG. 20. In some examples, as shown in FIG. 21, at 2100, a fifth metal layer 454 is deposited over the fifth ILD layer 448 and etched to form an upper capacitor plate 456 and fuse 458. In some examples, at 2200, a surface 460 of the fuse 458 is etched according to a fuse etching pattern to form a current crowding portion 462. The current crowding portion 462 at the fuse 458 can function as a fusible link, and thus determine or define an amount of current that can be received at a corresponding pad, as described herein.

Figure 22:
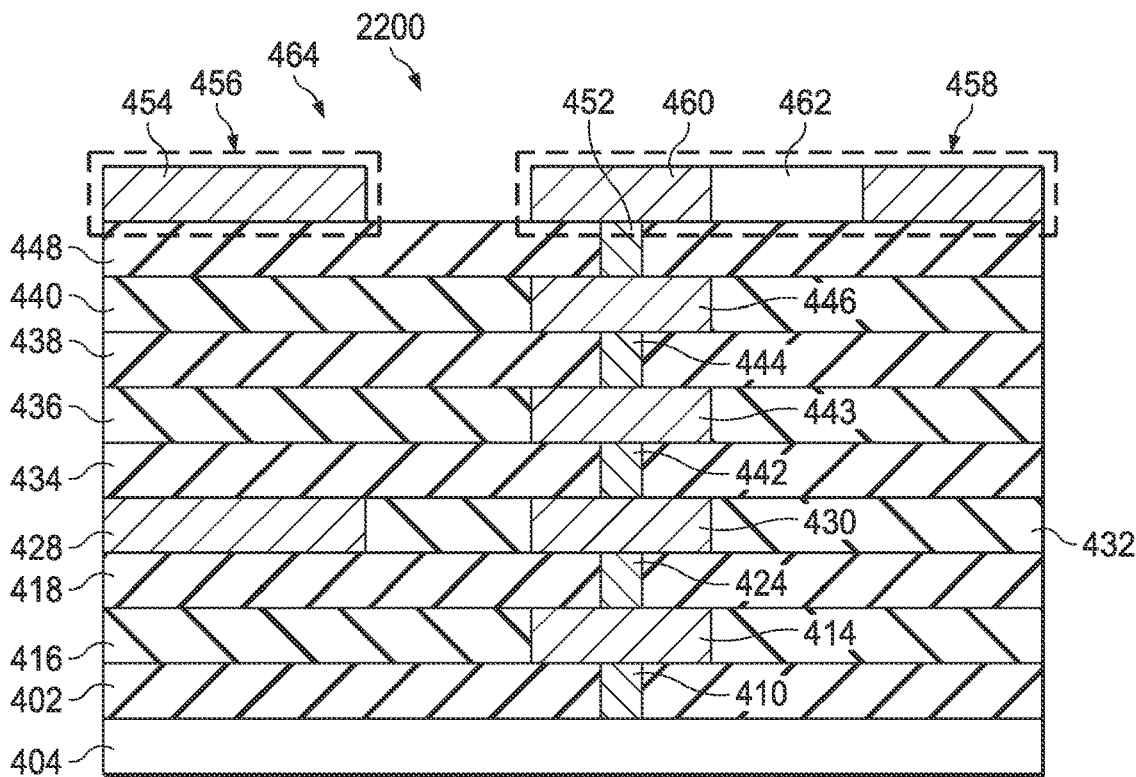
Figure 24:
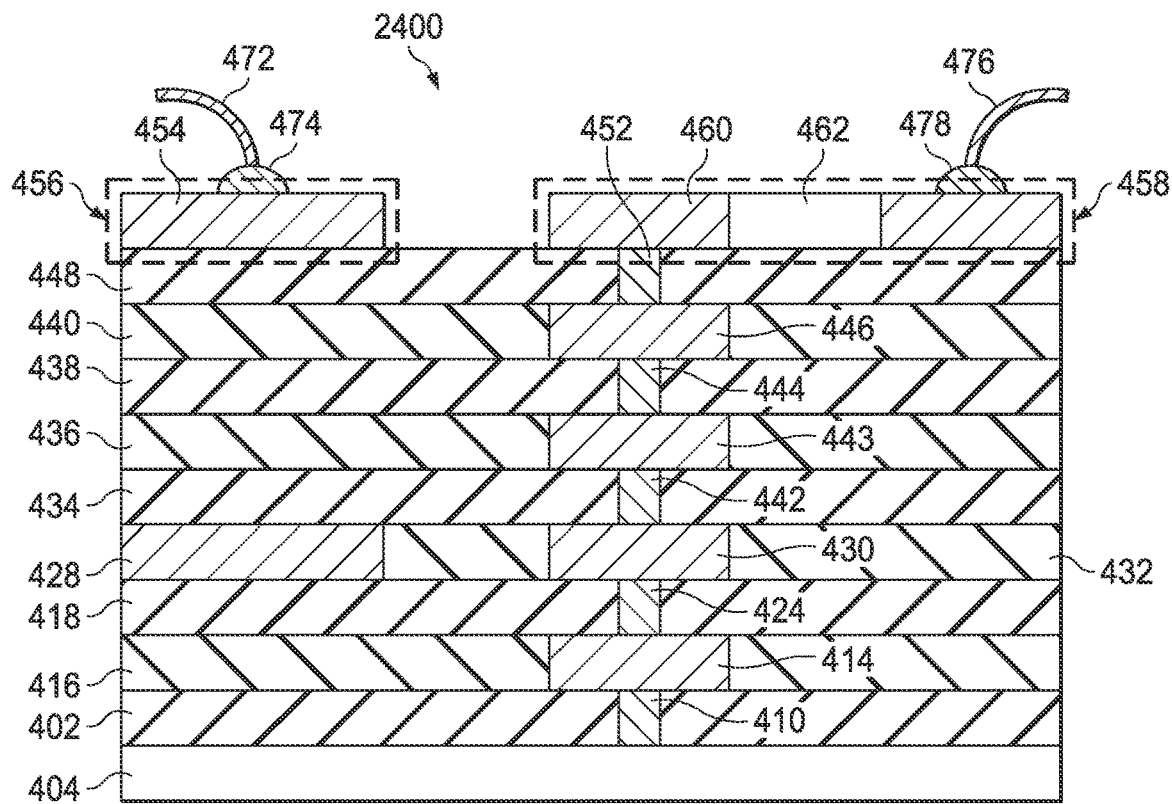

As shown in FIG. 22, the fuse 458 can be etched according to the fuse etching pattern, such that a width of the fuse 458 is reduced at a location along a length of the fuse 458, thereby limiting an amount of current that can flow through the fuse 458 in contrast to non-etched portions of the fuse 458. In some examples, the fuse 458 has an etch pattern similar to one of the etch patterns of the current crowding portions 214, 216, and 218, as shown in FIG. 2. Accordingly, the fuse 458 can be etched to form the current crowding portion 462, so as to result in an isolator die 464, as shown in FIG. 22. The isolator die 464 can correspond to the isolator die 102, as shown in FIG. 1.

In some examples, at 2300, as shown in FIG. 23, the isolator die 464 is attached to a lead frame assembly 466 that can include conductive leads 468 and a die mounting pad 470. As shown in FIG. 23, the isolator die 464 can be attached to the die mounting pad 470. An adhesive material can be used to secure the isolator die 464 to the die mounting pad 470. For example, the adhesive material may be a polymeric type of material for attaching the isolator die 464 to the die mounting pad 470. In other examples, a solder, another bonding agent, or attachment device can be used to secure the isolator die 464 to the die mounting pad 470. In some examples, the upper capacitor plate 456 and fuse function as bond pads. In some examples, at 2400, a first end of a bond wire 472 is bonded to the upper capacitor plate 456 by a ball bond 474. In some examples, the first end of the bond wire 472 is bonded to the upper capacitor plate 456 by a stitch bond.

In some examples, at 2400, a first end of a bond wire 476 is bonded to the fuse 458 by a ball bond 478. In some examples, the first end of the bond wire 476 is bonded to the fuse 458 by a stitch bond. As shown in FIG. 25, at 2500, second ends of the bond wires 472 and 476 can be coupled to a respective conductive lead of the conductive leads 468. At 2600, a structure, as shown in FIG. 25, can be encapsulated by a molding compound 480 to provide a packaged semiconductor isolator device 482, as shown in FIG. 26. As an example, the molding compound 480 can be an epoxy based molding compounding. In some examples, the packaged semiconductor isolator device 480 includes the IC 100, as shown in FIG. 1.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

Modifications are possible in the described embodiments, and other embodiments are possible, within the scope of the claims.

What is claimed is:

1. A semiconductor device comprising:
   first and second conductive layers positioned over a substrate;
   at least one dielectric layer between the first and second conductive layers, wherein the at least one dielectric layer is positioned over at least a portion of the second conductive layer, and the first conductive layer is positioned over a portion of the at least one dielectric layer; and
   a third conductive layer positioned over the substrate and conductively connected to the second conductive layer and the substrate, wherein the third conductive layer includes a fusible link having fuse body connected to two fuse terminals by corresponding tapered metal portions.

2. The semiconductor device of claim 1, further comprising an interconnection network conductively connected to the third conductive layer and to the second conductive layer.

3. The semiconductor device of claim 1, wherein the portion of the at least one dielectric layer is a first portion, and the third conductive layer is positioned over a second portion of the at least one dielectric layer.

4. The semiconductor device of claim 1, wherein the fusible link is located at a same metal layer as the first conductive layer.

5. The semiconductor device of claim 1, wherein the substrate is located in a device package, a first wire is connected between a first package terminal and the first conductive layer, and a second wire is connected between a second package terminal and the fusible link.

6. The semiconductor device of claim 5, wherein the device package is a molded plastic package.

7. An integrated circuit (IC) comprising:
   upper and lower electrodes located over a substrate, and separated by a dielectric layer, the lower electrode located directly between the upper electrode and the substrate;
   an interconnect network that conductively connects the lower electrode to the substrate and to a first terminal of a fusible link; and
   a wire bonded to a second terminal of the fusible link.

8. The IC as recited in claim 7, wherein the fusible link is at a same metal level as the upper electrode.

9. The IC as recited in claim 7, wherein the interconnect network includes a plurality of vertically stacked metal portions.

10. The IC as recited in claim 7, wherein the fusible link is connected to the first terminal and second terminal by tapered portions with a maximum width less than a width of the first and second terminals.

11. The IC as recited in claim 7, wherein the lower electrode is connected to a transistor gate electrode.

12. The IC as recited in claim 7, wherein the upper and lower electrodes include first and second plates of a parallel plate capacitor.

13. A semiconductor device comprising:
   first and second conductive layers positioned over a substrate located in a device package;
   at least one dielectric layer between the first and second conductive layers, wherein the at least one dielectric layer is positioned over at least a portion of the second conductive layer, and the first conductive layer is positioned over a portion of the at least one dielectric layer;

a third conductive layer positioned over the substrate and conductively connected to the second conductive layer and the substrate, wherein the third conductive layer includes a fusible link;

a first wire connected between a first package terminal and the first conductive layer; and a second wire is connected between a second package terminal and the fusible link.

14. The semiconductor device of claim 13, further comprising an interconnection network conductively connected to the third conductive layer to the second conductive layer.

15. The semiconductor device of claim 13, wherein the portion of the at least one dielectric layer is a first portion, and the third conductive layer is positioned over a second portion of the at least one dielectric layer.

16. The semiconductor device of claim 13, wherein the fusible link is located at a same metal layer as the first conductive layer.

17. The semiconductor device of claim 13, wherein the device package is a molded plastic package.

\* \* \* \* \*